United States Patent [19]
Ehrhardt

[11] Patent Number: 5,119,027
[45] Date of Patent: Jun. 2, 1992

[54] NUCLEAR MAGNETIC RESONANCE IMAGING METHOD

[76] Inventor: James C. Ehrhardt, 1029 E. Ct., Iowa City, Iowa 52240

[21] Appl. No.: 393,138

[22] Filed: Aug. 14, 1989

[51] Int. Cl.⁵ .............................................. G01V 3/00
[52] U.S. Cl. ..................................... 324/309; 324/307
[58] Field of Search ............... 324/300, 307, 309, 310, 324/314; 128/653 A; 364/413.13, 413.15; 382/43, 56

[56] References Cited

U.S. PATENT DOCUMENTS

| | | | |
|---|---|---|---|
| 4,070,611 | 1/1978 | Ernst | 324/309 |
| 4,319,190 | 3/1982 | Brown | 324/309 |
| 4,468,621 | 8/1984 | Hinshaw | 324/309 |
| 4,506,222 | 3/1985 | Edelstein et al. | 324/309 |
| 4,509,015 | 4/1985 | Ordidge et al. | 324/309 |
| 4,701,706 | 10/1987 | Haacke | 324/309 |

OTHER PUBLICATIONS

C. B. Ahn, J. M. Kim and Z. H. Cho. High-speed spiral-scan planar NMR imaging-I, IEEE Transactions on Medical Imaging, vol. MI-5, 2-7, 1986.
W. A. Edelstein, J. M. S. Hutchinson, G. Johnson, and T. Redpath. Spin warp imaging and applications to human whole-body imaging. Physics in Medicine and Biology, vol. 25, 751-756, 1980.
R. M. Mersereau. The processing of hexagonally sampled two-dimensional signals. Proceedings of the IEEE, vol. 67, 930-949, 1979.
R. M. Mersereau and T. C. speake. A unified treatment of Cooley-Tukey algorithms for the evaluation of the multidimensional DFT. IEEE Transactions on Acoustics, Speech, and Signal Processing. vol. ASSP-29, 1011-1017, 1981.
D. E. Petersen and D. Middleton. Sampling and reconstruction of wave number limited functions in N-dimensional Euclidian spaces. Information and Control, vol. 5, 279-323, 1962.

*Primary Examiner*—Hezron E. Williams
*Assistant Examiner*—Louis M. Arana
*Attorney, Agent, or Firm*—James C. Nemmers

[57] ABSTRACT

The invention relates to nuclear magnetic resonance (NMR) imaging and spectroscopy in which a combination of pulsed radio frequency fields and gradient magnetic fields, called pulse sequences, are used to acquire data from a sample's nuclear spins. Using the principles of the invention, these fields are manipulated so as to yield data points that cover a multidimensional space in a regular fashion. Information is then reconstructed from this data by performing an inverse discrete Fourier Transform (IDFT) on the data set. Many varieties of pulse sequences can be used, such as spinwarp imaging, half-Fourier techniques, echo-planar techniques, and chemical shift imaging. The invention may be used for two, three or four-dimensional studies where the dimensions may be any combination of the three spatial dimensions and the signal frequency. In two dimensions, hexagonal sampling patterns are the most efficient, providing an efficiency gain of 13.4%. In three dimensions, body-centered cubic patterns are the most efficient providing a gain of 29.3%. The gains thus achieved can be used to reduce the procedure time or improve the quality of the resulting image. Also, a new fast algorithm for computing the IDFT in these cases is used to perform the reconstruction for output pixels on a rectangular array.

4 Claims, 2 Drawing Sheets

FIG. 2
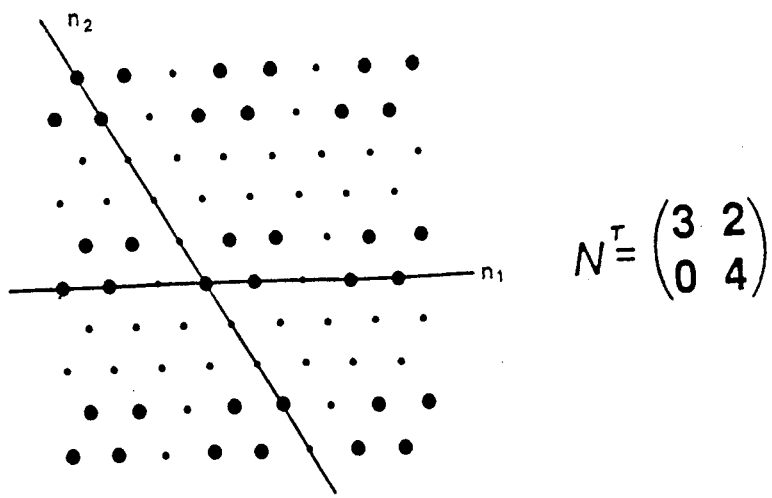
$$N^T = \begin{pmatrix} 3 & 2 \\ 0 & 4 \end{pmatrix}$$
FIG. 3A
Sampling Pattern
FIG. 3B
Sampling Matrix
FIG. 3C
Aliasing Pattern
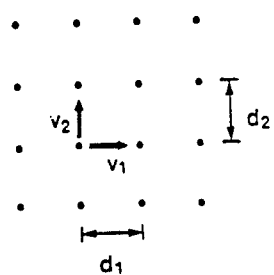
$$V = \begin{pmatrix} d_1 & 0 \\ 0 & d_2 \end{pmatrix}$$
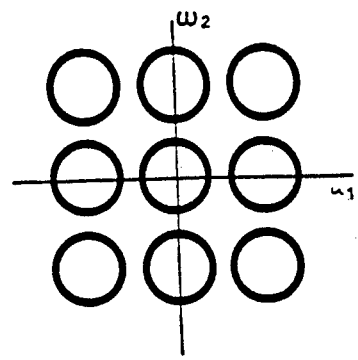
FIG. 4A
Sampling Pattern
FIG. 4B
Sampling Matrix
FIG. 4C
Aliasing Pattern
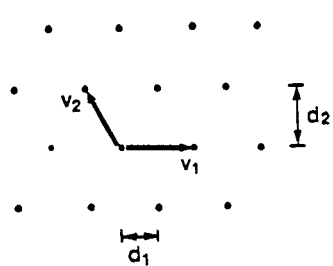
$$V = \begin{pmatrix} 2d_1 & -d_1 \\ 0 & d_2 \end{pmatrix}$$
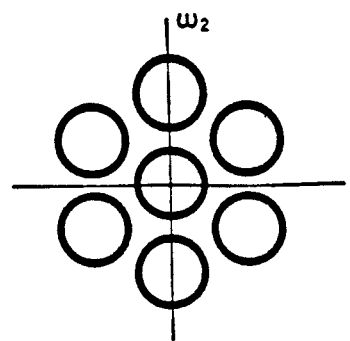

NUCLEAR MAGNETIC RESONANCE IMAGING METHOD

BACKGROUND OF THE INVENTION

This invention relates to the field of nuclear magnetic resonance (NMR) imaging and spectroscopy. NMR pulse sequences are sets of radio frequency pulses, gradient magnetic fields, and data acquisition schemes that define a particular NMR procedure. In NMR procedures, there are used a large number of different types of pulse sequences, each of which may have certain advantages in particular circumstances. NMR imaging and spectroscopy is most often performed with pulse sequences in which the raw data are samples of the multi-dimensional inverse Fourier transform of the desired image. These pulse sequences usually employ a data sampling grid that covers space in a rectangular pattern. By an appropriate choice of gradient magnetic fields and sampling timing, the data samples are obtained on a regular rectangular grid of points in what is known as k-space. By a rectangular grid is meant any grid in two or more dimensions whose lattice basis vectors form an orthogonal set. The vectors need not be of equal magnitude.

This rectangular grid is inefficient when the data is isotropically band-limited as it is when used in medical procedures. Moreover, pulse sequences for two, three and four-dimensional data sets are severely limited by the lengthy data acquisition process. NMR studies on clinical patients consist of several different pulse sequences and typically last an hour in order to produce an image of adequate diagnostic quality. This amount of time greatly increases the already high cost of the procedure, and if used on seriously ill patients, the patient may lack the tolerance necessary to complete the procedure. Therefore, the diagnostic quality of the procedure is often limited because of the reduced time involved. Moreover, system computer limitations on raw data storage and data throughput rates may also limit the type and quality of the procedures that may be performed.

As previously indicated, almost all currently know techniques acquire data in a rectangular sampling pattern. However, this sampling pattern is optimum only for imaging objects which completely fill a rectangular field of view. In medical applications, the images more nearly fill a circular field of view. Thus rectangular sampling is especially inefficient in these cases. Also, in medical applications the body cross-section being imaged frequently will extend in one direction beyond the selected field of view. When this happens, the image reconstruction algorithm produces an aliased image consisting of the parts that are out of the field of view superimposed on the normal image. This can make image interpretation difficult. Techniques exist that eliminate this problem by increasing the sampling density by acquiring twice as much data to give an actual field of view twice as large as the nominal value, but this greatly increases the time of the procedure. More efficient data sampling techniques are therefore desirable in order to reduce the number of data points required to be collected, and data points and time would be reduced if efficient sampling patterns were available and used. Achieving reduction in data points would thus speed the patient examination, improve the cost-effectiveness of the procedure and reduce the data storage and throughput requirements.

There is therefore a need for a new method of data acquisition using more efficient sampling patterns and a new faster algorithm for computing the inverse discrete Fourier transform (IDFT) in these cases to perform the reconstruction for output pixels on a rectangular array. Such a new method must be capable of increasing the efficiency when used with most types of pulse sequences. Moreover, such a new method must be capable of producing an image of improved quality when the same amount of data and time are used with the more efficient sampling technique. In particular, there is a need for more efficent production of NMR images with higher spatial resolution.

SUMMARY OF THE INVENTION

This invention consists of a data acquisition method for NMR imaging and spectroscopy and an associated algorithm for reconstructing the spatial image and frequency content of the object being examined. Most pulse sequences for multi-dimensional NMR data acquisition obtain data points from a rectangular grid of sample points throughout k-space. Images and spectra are reconstructed by performing an inverse discrete Fourier transform on the data set. Accomplishing this in a practical amount of computer processing time requires a fast algorithm of the general class known as fast Fourier transforms.

As previously noted, the rectangular data grid is inefficient for studying many objects. If the data are isotropically band-limited, as they are in medical applications, the most efficient sampling patterns are hexagonal and body-centered cubic grids in two and three dimensions, respectively. The invention involves the use of these efficient sampling patterns for multi-dimensional NMR data acquisition.

Standard fast Fourier transform algorithms are not applicable to the method of the invention. New algorithms for computer processing have therefore been created. These algorithms produce the fast Fourier transform of efficiently sampled data sets on a rectangular grid of output pixels. No interpolation is needed. The rectangular output grid is used because commercially available hardware and software use this image structure. In two dimensions, hexagonal sampling patterns are the most efficient, producing an efficiency gain of 13.4%. In three dimensions, body-centered cubic patterns are the most efficient producing a gain of 29.3%. These gains can be used to reduce the lengthy procedure time or to improve the quality of the resulting images.

BRIEF DESCRIPTION OF THE DRAWINGS

FIG. 2 is a diagram illustrating hexagonally sampled data periodically extended in a rectangular array;

FIGS. 3A, 3B and 3C are diagrams that illustrate a typical rectangular sampling sampling matrix and the corresponding rectangular pattern of image aliases produced by the discrete Fourier transform; and FIGS. 4A, 4B and 4C are diagrams similar to FIGS. 3A, 3B and 3C and showing a hexagonal sampling pattern and the pattern of image aliases, with the reciprocal lattice vectors of the hexagonal sampling pattern yielding an hexagonal pattern lattice of image aliases.

DESCRIPTION OF THE PREFERRED EMBODIMENT OF THE INVENTION

Figure 1:
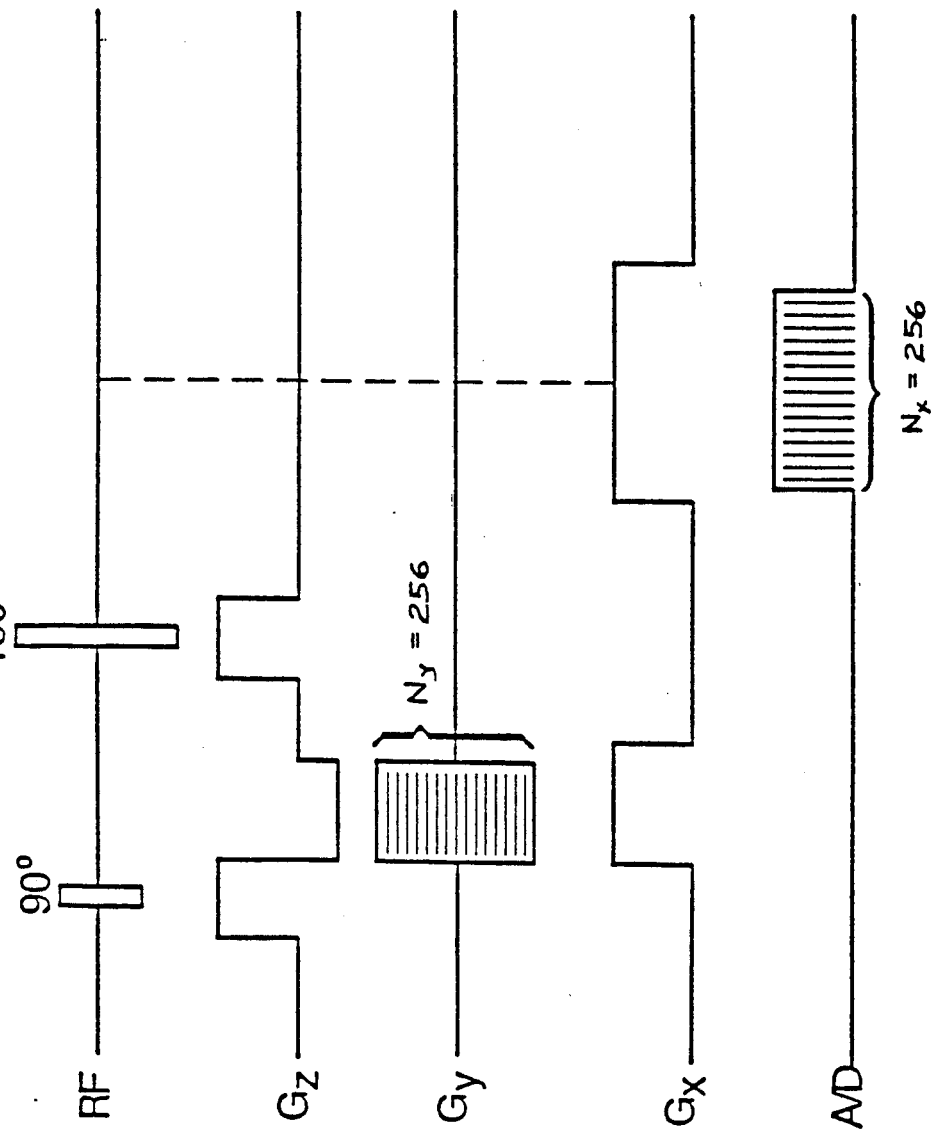
FIG. 1 is a two dimensional spin-warp pulse sequence diagram showing the different events during an NMR pulse sequence as a function of time along, the horizontal axis.

This invention is for a data acquisition method for NMR pulse sequences and the associated computer processing algorithms to be used in NMR imaging and spectroscopy. The method of the invention may be used for two, three or higher dimensional studies where the dimensions may be any combination of the three spatial dimensions and the signal frequency.

In common spin-warp or Fourier transform imaging methods, gradient magnetic fields are pulsed at appropriate times in the pulse sequence to produce phase-encoding and/or frequency encoding. In FIG. 1, there is illustrated a typical pulse sequence. Two RF pulses flip the object's nuclear spins a total of 90 and 180 degrees respectively from the axis of the applied static magnetic field. Gradient magnetic fields ($G_x$, $G_y$, $G_z$) in the X, Y, and Z directions are pulsed on at appropriate times to produce frequency encoding, phase encoding and slice selection, respectively. An analog to digital converter (A/D) is turned on at the time of signal emission from the object being studied to record $N_z$ evenly spaced samples from the signal. This sequence is then repeated $N_y$ times with $N_y$ different evenly spaced values of the phase encoding gradient. This sequence yields a data set which samples k-space uniformly in a rectangular pattern.

To produce hexagonal sampling, $G_x$ and $G_y$ must be adjusted so that the horizontal and vertical sampling intervals are close to 1.1547 and the analog to digital converter set so that the origin of every other row of data is offset by one half of a sampling interval. Each signal, either echo or free induction decay, is sampled at uniform time intervals to produce one row of data of the multi-dimensional data set. This sequence is repeated with different values of the phase-encoding gradient field, each repetition yielding a different row of data. The pulse sequence illustrated in FIG. 1, for example, may be used to obtain $N_z=256$ data samples in each row of data and a total of $N_y=256$ rows. The data samples are obtained on a regular, rectangular grid in the data space, which is called k-space. This is done in such a manner that the complete data set may be considered as a sample of the multi-dimensional Fourier transform of the object being studied. An image of the object is reconstructed by performing an inverse discrete Fourier transform (IDFT) on the data. Since the data sets may be very large, a fast algorithm, which is called a Fast Fourier Transform (FFT), is necessary to perform the calculation in an acceptable time.

The method of the invention uses a different timing and a different series of gradient magnetic fields to collect data samples in a more efficient pattern than the rectangular grid. For isotropically band-limited functions in two dimensions, a hexagonal grid is optimal; in three dimensions, a body-centered cubic (BCC) grid is optimal; and for higher dimensions, the sampling locations are given by the reciprocal lattice of the centers of densely packed M-dimensional hyperspheres. These optimal sampling patterns are advantageous because they require 13.4%, 29.3% and 50% fewer data points (for two, three and four dimensions, respectively) than rectangular sampling methods. The invention therefore can be used to reduce the data acquisition time while maintaining image resolution, or to improve the image resolution while maintaining the imaging time, or some combination of the two.

In three and four dimensions, the optimal sampling schemes may be used. However, in two dimensions, a slight modification is necessary. Use of a discrete Fourier transform implies that the data is periodically extended or replicated beyond the ends of the data set. This replication pattern determines the location of the transform output points discussed above. To obtain output points on a rectangular grid in multiple dimensions, the assumed data replication must be in a rectangular pattern in the corresponding directions. But this is not possible for regular hexagonal sampling because the ratio of the horizontal and vertical sampling intervals is 2/SQRT(3), an irrational number equal to about 1.1547. Thus, instead of regular hexagonal sampling, hexagonal sampling in which the ratio of horizontal and vertical sampling intervals is a rational number close to 1.1547 is required. Sampling intervals with ratios of 8/7, 9/8, 37/32, 64/55, 128/111, 147/128, 256/222 etc. are appropriate. Since the reconstruction will generally require FFTs of dimensions given by these integers, ratios that involve large prime numbers would require more complex programming. The specific two-dimensional implementation given as an example in this application uses sampling intervals in a ratio of 8/7. This is within 1 percent of the optimal value and has an image reconstruction algorithm that only involves a single FFT of dimension 7, which is documented in the literature, in addition to powers-of-2 FFTs.

Implementation of the principles of the invention ma be done as follows. In two-dimensional imaging with a frequency-encoding gradient and a phase-encoding gradient, hexagonal sampling oriented along the frequency-encoded gradient may be done by adjusting the sampling interval times and offsets from the origin o alternate rows of data. No time savings is produced in this case because the same number of phase-encoding gradient steps are required. However, advantages of this technique are that the total amount of computer memory required for raw data storage and the rate of data acquisition are both 12.5 percent less than when standard rectangular techniques are used. Another application would be to minimize the effects of image wrap-around or aliasing. Standard anti-aliasing techniques use sampling intervals on half normal size to produce a field of view that is twice as large and then discard the outer portions of the field of view. For example, if this technique were used with a 256x256 image, it would require a 512×512 data set and have an acquisition time of 512 phase-editing steps. With hexagonal sampling oriented in the vertical direction, a 448x512 data set would have the same resolution in 7/8 of the time required for the standard technique.

Another method to achieve hexagonal sampling would be to use oscillating gradients during data readout.

In three-dimensional imaging with a frequency-encoding gradient and two phase-encoding gradients, hexagonal sampling in the two phase-encoding dimensions is accomplished by proper choice of phase-encoding gradient values. This can result in a 13% savings. BCC sampling in this case also requires an oscillating gradient during read-out. This produces a 29% savings. In two, three or four dimensional spectroscopy with $M-1$ phase-encoding gradients and no frequency-encoding gradient, optimal sampling in $M-1$ dimensions is achieved by choosing the phase-encoding gradients appropriately. Fully optimal sampling in all M dimensions also requires oscillating gradients during data read-out. Other methods for obtaining samples at the proper points may also be used.

For all the above methods, the timing of data collection points on a single echo or FID must be adjusted for the offset of data samples on alternate rows.

Image reconstruction from magnetic resonance data is most commonly and speedily accomplished by performing a Fourier transform of the data. However, because the data points are in a non-rectangular pattern, a standard FFT will not be suitable for image reconstruction calculations, and therefore a new and different algorithm is needed. One requirement for this new algorithm is that its output points must be calculated on a rectangular grid because this is the pattern that commercial hardware and software use for image display and analysis. Use of a grid other than rectangular necessitating interpolation to a rectangular image grid would add an unnecessary amount of processing time. I have therefore developed a fast algorithm for each of the efficiently sampled multi-dimensional cases, which algorithms produce an output of rectangular pixels with no interpolation, regardless of data sampling geometry. Without these algorithms, lengthy reconstruction times would render the efficient sampling schemes impractical.

To accomplish the foregoing, it is known that any discrete Fourier transform (DFT) assumes that the data is periodically extended or replicated beyond the original data set, such as:

$$F(k) = F(k + N^T r)$$

where $N^T$ is the periodicity matrix of the date as illustrated in FIG. 2 and r is any integer vector. $N^T$ is also the transpose of the periodicity matrix, N, of the image. In FIG. 2, the lines represent the coordinate axes, and the dots represent data sampled at locations in a hexagonal pattern. The basic data consists of $3 \times 4 = 12$ data points. The discrete Fourier transform assumes that these points are extended periodically in a rectangular fashion. This is illustrated by the set of 4 large dots that is repeated horizontally and vertically throughout space. The basis vectors of the repetition pattern are (3,0) and (2,4) in the given coordinate system. The columns of the periodicity matrix, $N^T$, are given as illustrated by the basis vectors. The pattern of output pixels is determined by $N^T$. For example, if data sampled in any fashion, including hexagonal or body-centered cubic, are extended in a rectangular pattern as illustrated in FIG. 2, the output pixels from the IDFT will be in a rectangular pattern.

A generalized IDFT for a multidimensional sequence is $$f(n) = \frac{1}{|det\, N|} \sum_k F(k)\, e^{2\pi i k' N^{-1} n}$$

where N is the periodicity matrix of the data. The new fast algorithms for computing this DFT factor N into a product of simpler matrices. The periodicity matrix is given below for hexagonal sampling with a ratio of horizontal to vertical sampling intervals of 8/7, sampling lattice basis vectors of (8/7,0) and (−4/7,1), and the number of horizontal data rows, M, equal to a multiple of 8.

$$N^T = \begin{bmatrix} 7M/8 & M/2 \\ 0 & M \end{bmatrix}$$

N may be factored as $$N = \begin{bmatrix} 7 & 0 \\ 4 & 1 \end{bmatrix} \begin{bmatrix} M/8 & 0 \\ 0 & M \end{bmatrix}$$

If the input and output indices are given by $$(k_1, k_2) = (mM/8 + i_1,\, i_2)$$

$$(n_1, n_2) = (7q_1 + p,\, mod\,(4q_1 + q_2,\, M))$$

where $m = 0,1,...,6;\ i_1 = 0,1,...,M/8-1;\ i_2 = k_2 = 0,1,...,M-1$ $p = 0,1,...,6;\ q_1 = 0,1,...,M/8-1;\ q_2 = 0,1,...,M-1$ the transform may be expressed as:

$$f(q_1, p, q_2) = \frac{8}{7M^2} \sum_{i_1, i_2} G(i_1, p, i_2)\, e^{8\pi i p(2i_1 - i2)/(7M)}\, e^{2\pi i(8q_1 i_1 - q_2 i_2)/M}$$

where $$G(i_1, p, i_2) = \sum_m F(i_1, m, i_2)\, e^{2\pi i pm/7}$$

Thus, the transform may be separated into a one-dimensional seven-point transform in the horizontal direction with a twiddle factor multiplication, and a standard $M/8 \times M$ 2-dimensional DFT. Each of these terms may be evaluated with standard FFT algorithms. Other factorizations of N may also be used to produce equivalent results.

For 3-dimensional body-centered cubic sampling with lattice basis vectors of (1,0,0), (0,1,0), and (0.5,0.5,0.5) and the even number, M, of data points in one row is even, the periodicity matrix of the data is $$N^T = \begin{bmatrix} M & 0 & -M \\ 0 & M & -M \\ 0 & 0 & 2M \end{bmatrix}$$

N may be factored as $$N = \begin{bmatrix} M & 0 & 0 \\ 0 & M & 0 \\ 0 & 0 & M \end{bmatrix} \begin{bmatrix} 1 & 0 & 0 \\ 0 & 1 & 0 \\ -1 & -1 & 2 \end{bmatrix}$$

This is implemented by a standard, rectangular three dimensional FFT, multiplication by twiddle factors, and a final two-point transform. Other factorizations of N may also be used to produce equivalent results.

For optimally efficient sampling in four dimensions, the sampling lattice basis vectors may be chosen as (1,0,0,0), (0,1,0,0,), (0,0,1,0) and (0.5,0.5,0.5,0.5). The periodicity matrix is defined analogously to the examples above and the FFT is derived similarly. In this case, an efficiency gain of 50 percent is obtained as compared to a rectangular technique.

The foregoing discussion has assumed a band-limited source. In imaging terms, this is equivalent to a finite sized object to be imaged. If the actual object is larger than the assumed size, the DFT produces aliasing or image wrap-around. The pattern of this aliasing is given by the reciprocal lattice vectors of the sampling pattern. For rectangular sampling, the aliasing occurs along the coordinate axes. For the optimal sampling schemes discussed in this specification, the aliasing occurs primarily along the diagonals. This is an advantage because in most imaging situations, the body tends to be elongated along the axes. Thus, optimal sampling reduces aliasing problems.

Rectangular sampling and its effects are illustrated in FIG. 3. FIG. 3A shows a set of points sampled in a rectangular pattern and the basis vectors, $V_1$ and $V_2$, of the sampling pattern. FIG. 3B gives the sampling matrix for these basis vectors; and FIG. 3C illustrates the resulting rectangular spectral aliasing of the discrete Fourier transform of a function whose spectrum is circular. Hexagonal sampling and its effects are illustrated in FIG. 4. FIG. 4A shows a set of points sampled in a hexagonal pattern and the basis vectors, $V_1$ and $V_2$, of the sampling pattern. FIG. 4B gives the sampling matrix for these basis vectors; and FIG. 4C illustrates the resulting hexagonal spectral aliasing of the discrete Fourier transform of a function whose spectrum is circular.

If the object being studied is not isotropically limited in extent, optimal sampling requires minor modification of the patterns discussed above to achieve alias-free imaging. Right cylindrical objects require hexagonal sampling in cross-section and regular sampling lengthwise. Ellipsoidal or ovate objects require scaling the sampling patterns appropriately.

This invention may be used in conjunction with many other types of pulse sequences to increase the efficiency of those techniques without sacrificing the unique advantages of those techniques. These methods include spin-warp imaging, two and three-dimensional Fourier transform imaging, Half-Fourier methods, echo-planar techniques, chemical shift imaging, etc. The higher the dimensionality of the technique the larger the efficiency gain by incorporation of the optimal sampling methodology of the invention.

Having thus described the invention in connection with a preferred embodiment thereof, it will be evident to those skilled in the art that various revisions and modifications can be made to the embodiment without departing from the spirit and scope of the invention described herein. It is my intention, however, that all such revisions and modifications that ar obvious to those skilled in the art will be included within the scope of the following claims.

What is claimed is as follows:

1. A method for nuclear magnetic resonance (NMR) imaging and spectroscopy to produce image information from an object being examined, said method comprising:
   (a) subjecting the object to be examined to a static magnetic field along a Z axis;
   (b) subjecting the object to be examined to sequences of radio frequency (rf) pulses and magnetic field gradients $G_x$, $G_y$ and $G_z$ in the X, Y and Z directions to produce rf signals from the object;
   (c) converting the rf signals from analog to digital to create a data set having a regular sampling pattern;
   (d) combining the magnetic field gradients and the said analog to digital conversion to produce a data set having a non-rectangular sampling pattern, the sampling pattern being:
      (i) a hexagonal grid in two dimensions; or
      (ii) a body-centered cubic grid in three dimensions; or
      (iii) in more than three dimensions, a grid in which the sampling locations are given by the reciprocal lattice of the centers of densely packed multi-dimensional hyperspheres;
   (e) either:
      (i) adjusting at least one of the magnetic field gradient amplitudes and the sampling interval times and offsets from the origin on alternate rows of data; or
      (ii) using oscillating gradients during data readout; so as to produce an optimal sampling pattern in two or more dimensions; and
   (f) reconstructing the image of the object from the non rectangular sampling patter of the data set so that image pixels are calculated at points on a rectangular grid in image space.

2. The method of claim 1 in which reconstruction of the image of the object from a data set having a hexagonal sampling pattern in two dimensions is determined using an inverse discrete Fourier transform of $$f(n) = \frac{1}{|det\ N|} \sum_k F(k)\ e^{2\pi i k'N^{-1}n}$$

where N is the periodicity matrix of the data set and in which the periodicity matrix is $$N^T = \begin{bmatrix} 7M/8 & M/2 \\ 0 & M \end{bmatrix}$$

and N is factored as $$N = \begin{bmatrix} 7 & 0 \\ 4 & 1 \end{bmatrix} \begin{bmatrix} M/8 & 0 \\ 0 & M \end{bmatrix}$$

and in which the input and output indices are given by $$(k_1, K_2) = (mM/8 + i_1,\ i_2)$$

$$(n_1, n_2) = (7q_1 + p,\ mod\ (4q_1 + q_2,\ M))$$

where $$m = 0,1,...,6;\ i_1 = 0,1,...,M/8-1;\ i_2 = k_2 = 0,1,...,\ M-1$$

the transfer is expressed as $$f(q_1,p,q_2) = \frac{8}{7M^2} \sum_{i_1,i_2} G(i_1,p,i_2)\ e^{8\pi i p(2i_1-i_2)/(7M)}\ e^{2\pi i(8q_1i_1+q_2i_2)/M}$$

where $$G(i_1,p,i_2) = \sum_m F(i_1,m,i_2)\ e^{2\pi i p m/7}$$

3. The method of claim 2 in which the periodicity matrix of the data set is $$N^T = \begin{bmatrix} M & 0 & -M \\ 0 & M & -M \\ 0 & 0 & 2M \end{bmatrix}$$

and the transform is applied to a three-dimensional body-centered cubic grid sampling pattern of the data set with lattice basis vectors of (1,0,0), (0,1,0) and (0.5,0.5,0.5) and the even number, M, of data points in one row is even, and N is factored as $$N = \begin{bmatrix} M & 0 & 0 \\ 0 & M & 0 \\ 0 & 0 & M \end{bmatrix} \begin{bmatrix} 1 & 0 & 0 \\ 0 & 1 & 0 \\ -1 & -1 & 2 \end{bmatrix}$$

4. The method of claim 3 in which the lattice basis vectors are (1,0,0,0), (0,1,0,0), (0,0,1,0) and (0.5,0.5,0.5,0.5) and the transform is applied to a four dimensional sampling pattern of the data set.

* * * * *